(12) United States Patent
Chen et al.

(10) Patent No.: US 7,435,618 B2
(45) Date of Patent: *Oct. 14, 2008

(54) METHOD TO MANUFACTURE A CORELESS PACKAGING SUBSTRATE

(75) Inventors: Bo-Wei Chen, Hsinchu (TW); Hsien-Shou Wang, Hsinchu (TW); Shih-Ping Hsu, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/635,034

(22) Filed: Dec. 7, 2006

(65) Prior Publication Data

US 2007/0249155 A1    Oct. 25, 2007

(51) Int. Cl.
*H01L 21/00* (2006.01)
*H01L 21/44* (2006.01)
*H01L 21/4763* (2006.01)

(52) U.S. Cl. .................. 438/106; 438/612; 438/618; 257/E23.145

(58) Field of Classification Search .............. 438/106, 438/382, 612, 622; 257/E23.145
See application file for complete search history.

(56) References Cited

U.S. PATENT DOCUMENTS

| | | | |
|---|---|---|---|
| 2003/0211727 A1 * | 11/2003 | Chen et al. ............... 438/632 |
| 2004/0053489 A1 * | 3/2004 | Kata et al. ................ 438/622 |
| 2004/0169287 A1 * | 9/2004 | Honda ...................... 257/778 |
| 2005/0023033 A1 * | 2/2005 | Saiki et al. ............... 174/260 |
| 2006/0012048 A1 * | 1/2006 | Murai et al. .............. 257/758 |
| 2006/0121719 A1 * | 6/2006 | Nakamura et al. ........ 438/613 |
| 2006/0180908 A1 * | 8/2006 | Yano et al. ................ 257/678 |
| 2006/0223236 A1 * | 10/2006 | Nomura et al. ........... 438/121 |
| 2007/0057363 A1 * | 3/2007 | Nakamura et al. ........ 257/698 |
| 2007/0096292 A1 * | 5/2007 | Machida .................. 257/700 |
| 2007/0132072 A1 * | 6/2007 | Chang ...................... 257/666 |
| 2007/0215490 A1 * | 9/2007 | Dow et al. ................ 205/775 |
| 2007/0231962 A1 * | 10/2007 | Fujii ........................ 438/107 |

* cited by examiner

*Primary Examiner*—Michelle Estrada
*Assistant Examiner*—Kevin A Parendo
(74) *Attorney, Agent, or Firm*—Bacon & Thomas PLLC

(57) ABSTRACT

A method for manufacturing a coreless packaging substrate is disclosed. The method can produce a coreless packaging substrate which comprises: at least a built-up structure having a first solder mask and a second solder mask, wherein a plurality of openings are formed in the first and second solder mask to expose the conductive pads of the built-up structure; and a plurality of solder bumps as well as solder layers formed on the conductive pads. Therefore, the invention can produce the coreless packaging substrate with high density of circuit layout, less manufacturing steps, and small size.

11 Claims, 5 Drawing Sheets

METHOD TO MANUFACTURE A CORELESS PACKAGING SUBSTRATE

BACKGROUND OF THE INVENTION

1. Field of the Invention

The present invention relates to a method to manufacture a coreless packaging substrate, particularly a method to manufacture a coreless packaging substrate that is applicable to non-through hole structures, to thereby increases density of circuit layout, and streamlines manufacture process.

2. Description of Related Art

With the development of the electronic industry, the research is gradually turning to high integration and miniaturization to meet the demands of multi-function, high speed, and high frequency for electronic products. Accordingly in semiconductor packaging, the circuit boards providing circuit connections among active and passive components are evolving from single layer boards to multi-layer boards in order to expand available areas of circuit layout on circuit boards within limited spaces by interlayer connection techniques, so as to accommodate higher wiring density for integrated circuits.

The process of common semiconductor devices proceeds first with providing chip carriers suitable to semiconductor chips, such as substrates or lead frames, then the chip carriers are forwarded to semiconductor packagers to proceed with chip-disposing, molding, and ball-mounting, etc.; finally, electronic devices having demanded functions are produced.

The semiconductor package structures known in the art are fabricated by mounting a semiconductor chip on the top of the substrate, followed by wire bonding or flip-chip packaging, and then forming solder balls on the back of the substrate to suffice electrical connections for a printed circuit board. Though high-number leads can be obtained compared with lead frames, usage on higher frequencies or operations at higher speed are restricted due to limited performance of the package structure attributed to lacks of both shorter paths of leads due to the core thickness and higher wiring density due to the land width of through holes.

In the method to manufacture packaging substrate, the whole steps of a conventional technique begins with a core substrate, which is then subjected to drilling, through hole electroplating, hole-plugging, and circuit formation to thereby accomplish an inner layer structure. A multi-layer carrier is then obtained through build-up processes. FIGS. 1A to 1E are schematic illustrations of a prior art. Referring to FIG. 1A, a core substrate 11 is prepared, which is composed of a core layer 111 having a predetermined thickness and a circuit layer 112 formed on the surface thereof. Meanwhile, a plurality of plating through holes 113 are formed in the core layer 111 to thereby electrically connect to the circuit layer 112. Subsequently, as shown in FIG. 1B, the core substrate 11 is subjected to a build-up process. First, a dielectric layer 12 is formed on the core substrate 11 with a plurality of openings 13 corresponding to the circuit layer 112. Then, as shown in FIG. 1C, a seed layer 14 is formed on the surface of the dielectric layer 12 by electroless plating or sputtering, and a patterned resistive layer 15 is formed on the seed layer 14, having a plurality of open areas 150 therein to thereby expose the parts of the seed layer 14. Subsequently as shown in FIG. 1D, a patterned circuit layer 16 and a plurality of conductive vias 13a are formed in the open areas 150 of the resistive layer 15 by electroplating through the seed layer 14, such that the patterned circuit layer 16 is electrically connected to circuit layer 112 through the conductive vias 13a; then the resistive layer 15 is removed and etching is carried out to thereby remove the seed layer 14 covered underneath the resistive layer 15, such that the first built-up structure 10a is formed. Finally, as shown in FIG. 1E, a second built-up structure 10b is formed on the surface of the first built-up structure by repeating the foregoing process, and layers are formed progressively in the same manner to obtain a multi-layer substrate 10.

However, in the process described above, a core substrate is formed by forming circuits on a core layer, followed by a build-up process on the core substrate, thereby forming a multi-layer substrate that complies with the required electrical design. As a result, the thickness of the final multi-layer substrate cannot be reduced, which is unfavorable to the developmental trend of a miniaturized semiconductor package structure. If the thickness of the core substrate is reduced to as thin as 60 μm or less, the manufacture of the multi-layer substrate will be seriously compromised, and the yield from the manufacture of substrate will decrease significantly.

In addition, there are extra steps in the manufacture of the core substrate, such as the hole-plugging and the scrubbing, which elevate the manufacture cost. More importantly, it is necessary to form a plurality of plating through holes in the core substrate; the diameter of the general through hole by drilling is approximately 100 μm or more, while the diameter of the conductive via (laser blind hole) is approximately 50 μm. In comparison, the process of plating through holes makes it more difficult to form a structure with finer circuits.

Moreover, in the process of multi-layer substrate described above, it is required to manufacture a core substrate prior to forming dielectric layers and circuit layers, which consequently complicates the process steps and increases the manufacture time, and raises the manufacture cost as well.

As a result, it is urgent for the industry to avoid the drawbacks of the previous technique, such as the increased thickness of substrate, low wiring density, low yield, complicated process steps, elevated manufacture time and cost.

SUMMARY OF THE INVENTION

In light of the shortcomings of the prior arts described above, the main objective of the present invention is to provide a method of manufacturing a packaging substrate, which can raise the wiring density and reduce the thickness of substrate, to thereby meet the developmental trend of miniaturization.

Another objective of the present invention is to simplify process steps, raise yield, shorten manufacture time, and reduce manufacture cost.

To achieve the above and other objectives, the present invention is to disclose a method of manufacturing a packaging substrate, which includes:

(A) providing a carrier board and forming a first dielectric layer on one surface of the carrier board, and forming a first resistive layer on the surface of the first dielectric layer, wherein a plurality of first openings are formed in the first resistive layer to expose parts of the carrier board;

(B) forming a first metal layer in each of the first openings, and removing the first resistive layer;

(C) forming a built-up structure on the surfaces of the first dielectric layer and the first metal layers, wherein the built-up structure includes at least a dielectric layer, at least a second metal layer of patterned circuit, a plurality of conductive vias, as well as a plurality of conductive pads;

(D) removing the carrier board;

(E) forming a first solder mask on the surface of the built-up structure and forming a second solder mask on the surface of the first dielectric layer, wherein a plurality of second openings are formed in the first solder mask to expose the conductive pads of the built-up structure, and a plurality of third openings are formed in the second solder mask to expose parts of the first dielectric layer, and the third openings correspond to the first metal layers each; and (F) forming a plurality of fourth openings in the exposed first dielectric layer to expose parts of the first metal layers.

Thereby the coreless packaging substrates prepared by the present invention have higher layout integration, simpler manufacturing procedures, and reduced general product thickness, and the goal of miniaturization is achieved.

The packaging substrate fabricated by the method of the present invention can be further comprises a step (G) after step (F), forming a plurality of solder bumps in the second openings in the first solder mask, and forming a plurality of solder layers in the third openings in the second solder mask.

Besides, the method of the present invention can further comprise a step (H) after forming the solder bumps and the solder layers in step (G): attaching at least a metal supporting frame on the surface of the first solder mask, so as to increase overall rigidity of the substrate.

In addition, the method of the present invention can further comprise a step (F1) before forming the solder bumps in the second openings and forming the solder layers in the third openings: forming a third metal layer as a post in at least one of the second openings in the first solder mask and the third openings in the second solder mask along with the fourth openings in the first dielectric layer, to thereby reduce the quantity of solder material needed for the solder bumps as well as the solder layers.

The build-up process to form a built-up structure in step (C) is well known in the art; thus the details are not described further here, wherein a multi-layer built-up structure can be obtained by repeating the build-up process.

Other objects, advantages, and features of the invention will become more apparent from the following detailed description when taken in conjunction with the accompanying drawings.

DETAILED DESCRIPTION OF THE PREFERRED EMBODIMENT

Figure 1A:
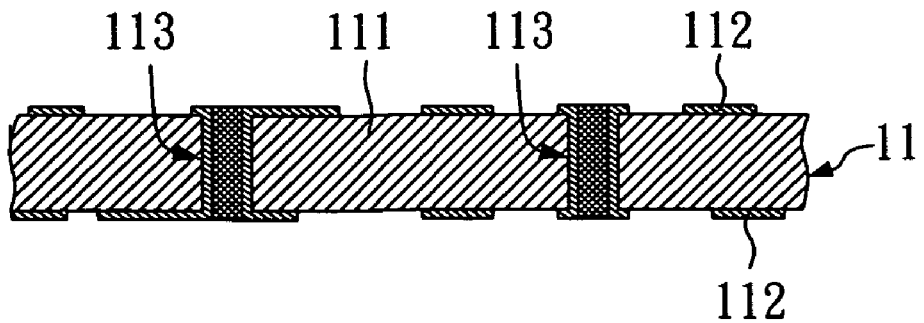
FIGS. 1A to 1E are cross-sections of a preferred embodiment of the coreless packaging substrate of prior arts.
Figure 1B:
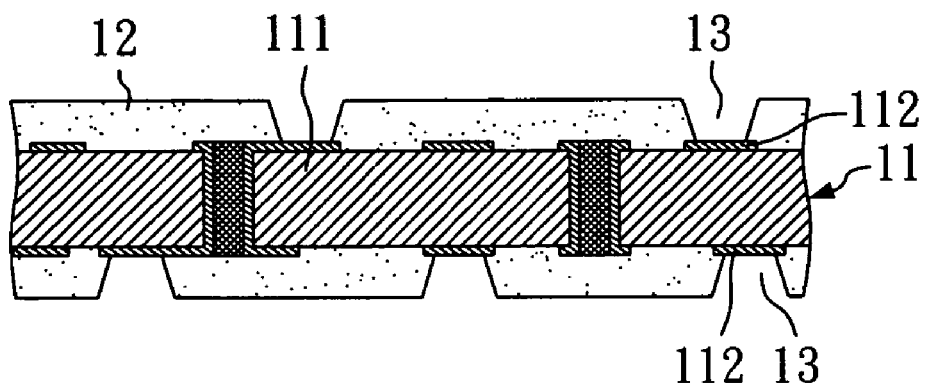
Figure 1C:
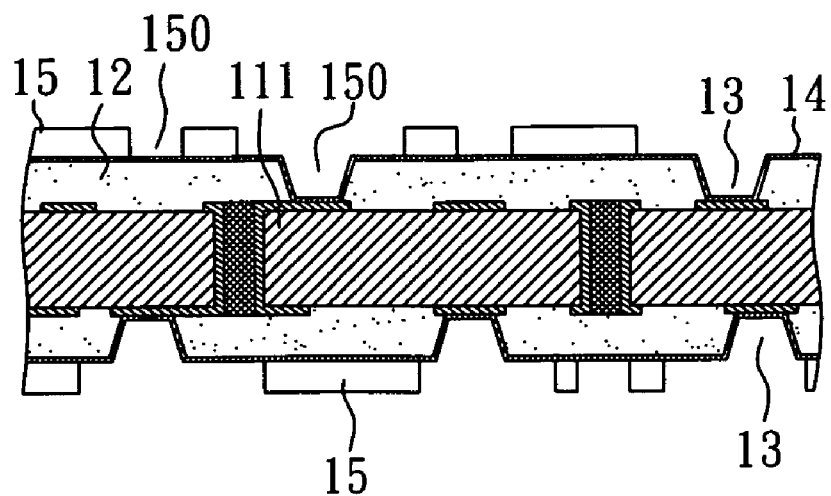
Figure 1D:
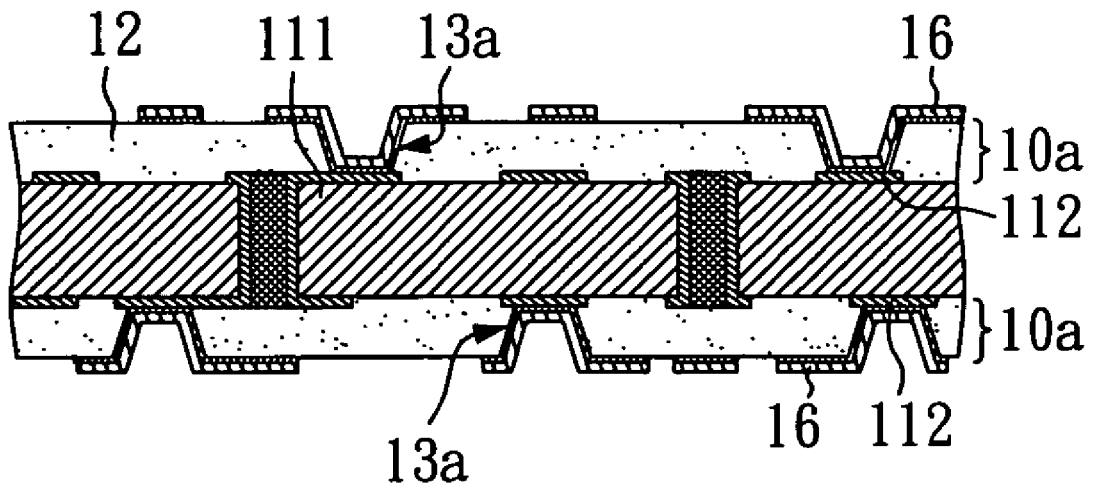
Figure 1E:
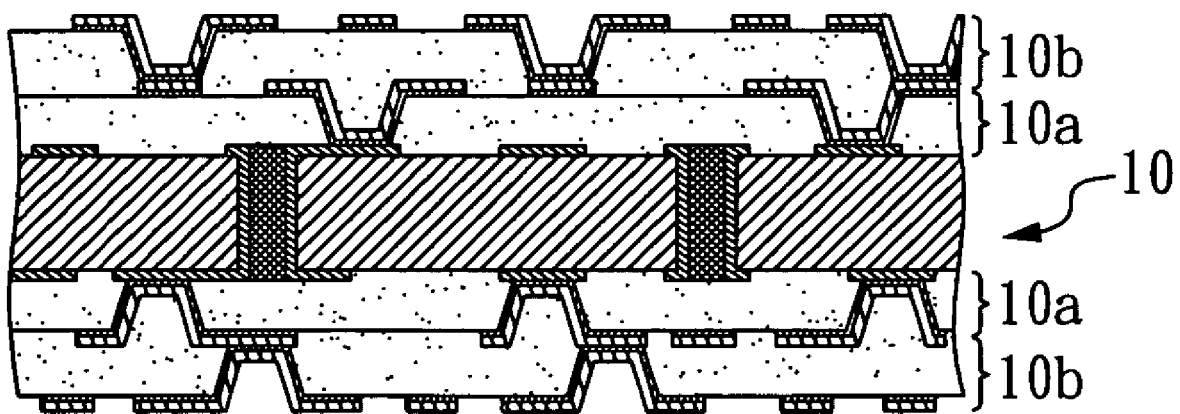
Figure 2A:
FIGS. 2A to 2P are cross-sections of a preferred embodiment of the coreless packaging substrate of the present invention.
Figure 2B:
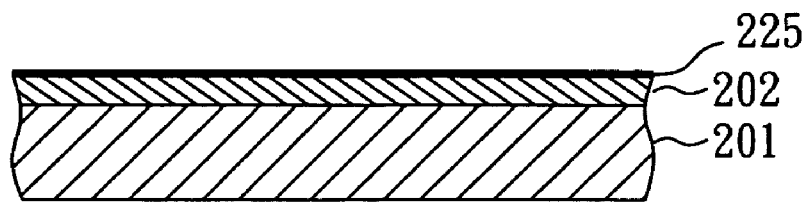
Figure 2C:
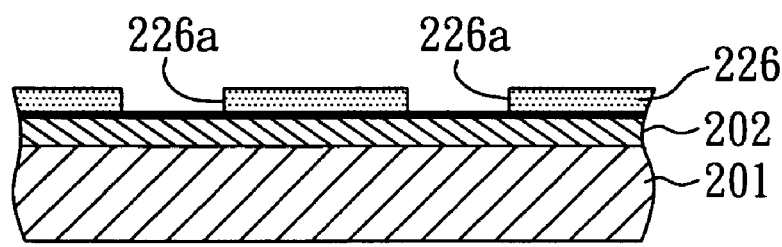
Figure 2D:
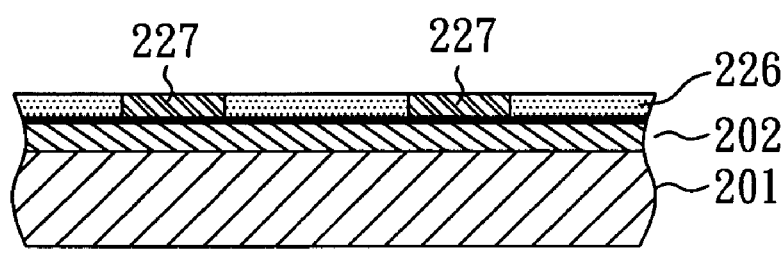
Figure 2E:
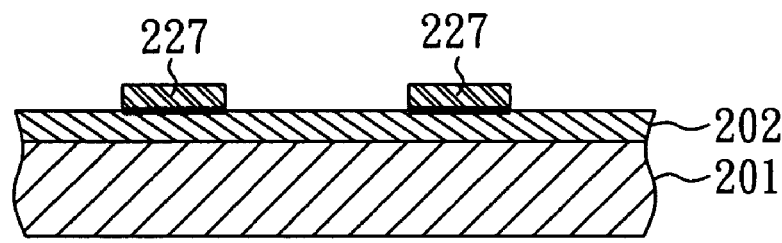
Figure 2F:
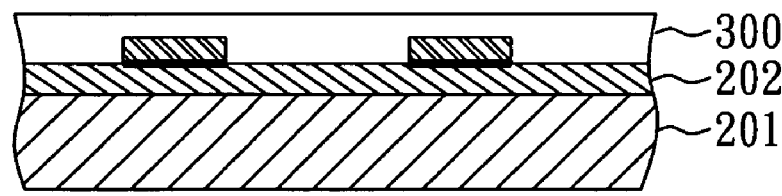
Figure 2G:
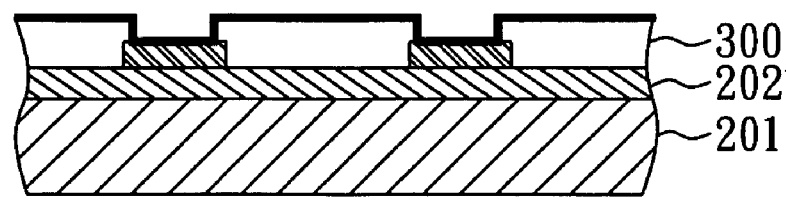
Figure 2H:
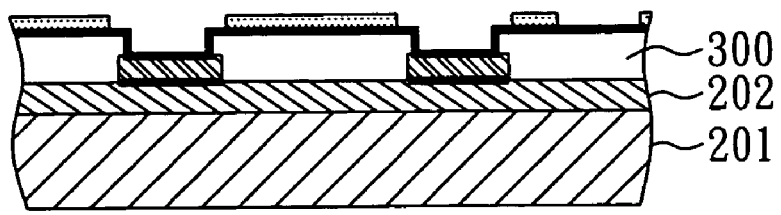
Figure 2I:
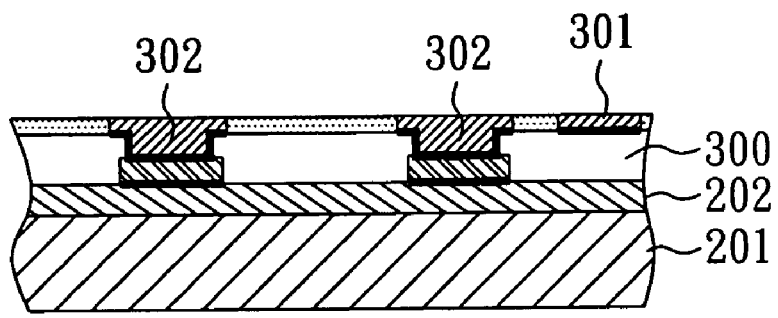
Figure 2J:
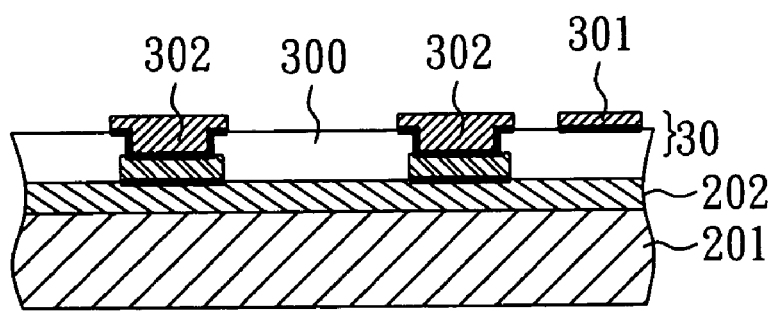
Figure 2K:
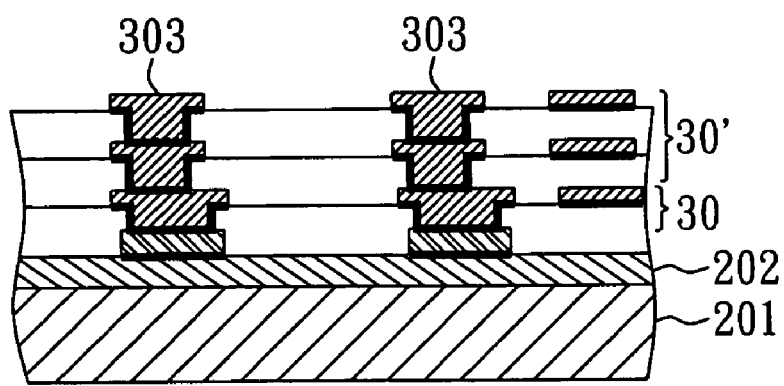
Figure 2L:
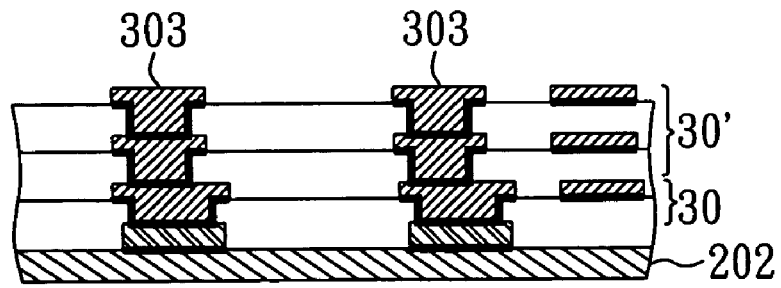
Figure 2M:
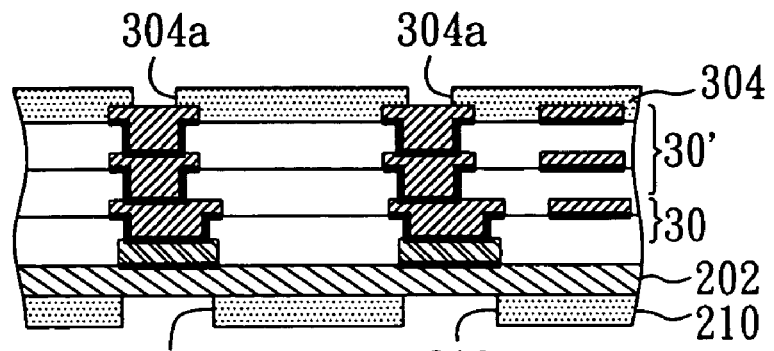
Figure 2N:
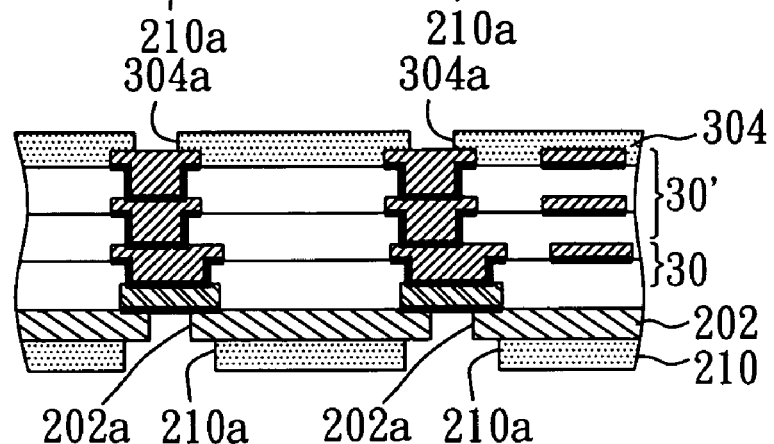
Figure 2O:
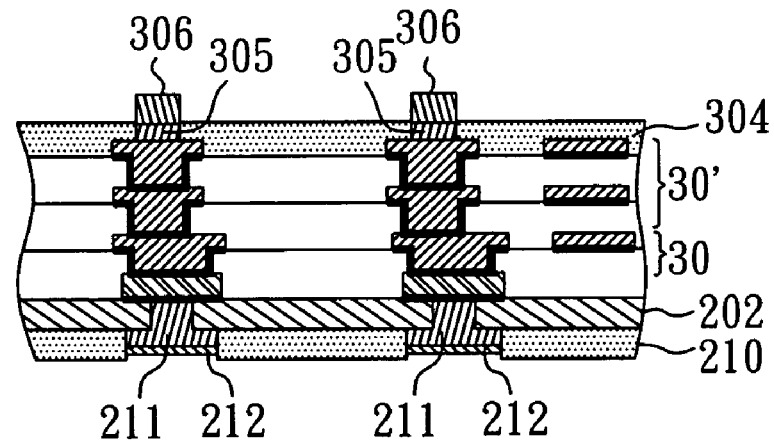
Figure 2P:
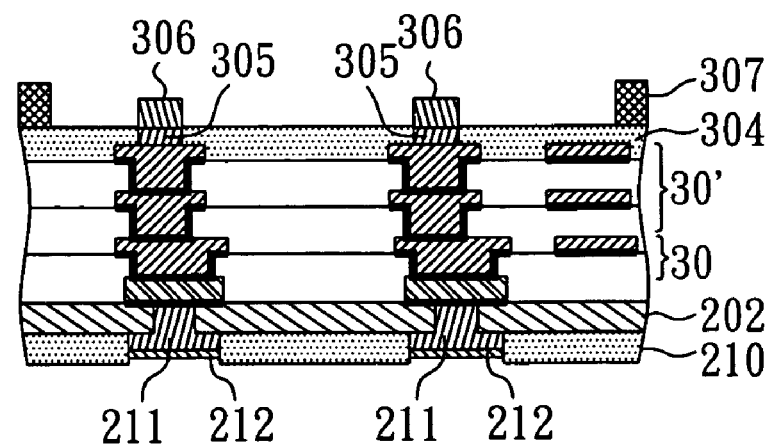

FIGS. 2A to 2P are the cross-sections of a preferred embodiment of the present invention. First, as shown in FIG. 2A, a carrier board 201 is provided; then as shown in FIG. 2B, a first dielectric layer 202 made of ABF (Ajinomoto Build-up Film) is formed on the carrier board 201, wherein a seed layer 225 is formed on the first dielectric layer 202 to facilitate subsequent electroplating process. Referring to FIG. 2C, a first resistive layer 226 is formed on the surface of the seed layer 225, and a plurality of first openings 226a are formed in the first resistive layer by photolithography to expose the seed layer 225. Subsequently, as shown in FIG. 2D, a first metal layer 227 is formed by electroplating in each of the first openings 226a. In this example, the seed layer 225 and the first metal layers 227 are copper layers, and the first metal layer 227 serves an electrical connection.

Then referring to FIG. 2E, the first resistive layer 226 is removed, and the seed layer 225 covered by the first resistive layer 226 is removed by etching. As shown in FIGS. 2F to 2J, a built-up structure 30 is further formed on the surfaces of the first dielectric layer 202 and the first metal layer 227. The build-up process is well known in the art; thus the details are not described further here. Wherein the built-up structure 30 includes a dielectric layer 300, a second metal layer 301 of patterned circuit, and a plurality of conductive vias 302, as shown in FIG. 2J.

Referring to FIG. 2K, another two built-up structures 30' are formed on the built-up structure 30, which includes a plurality of conductive pads 303.

Further referring to FIG. 2L, the carrier board 201 is removed by etching to thereby expose one surface of the first dielectric layer 202. Then referring to FIG. 2M, a first solder mask 304 is formed on the surface of the built-up structure 30', and a plurality of second openings 304a are formed in the first solder mask 304 by photolithography to expose the conductive pads 303 of the built-up structure 30'. Besides, a second solder mask 210 is formed in the exposed surface of the first dielectric layer 202, wherein a plurality of third openings 210a are formed in the second solder mask 210 by photolithography, corresponding to the first metal layers 227 each. As shown in FIG. 2N, a plurality of fourth openings 202a are formed by laser ablation in the first dielectric layer 202 to expose the seed layer 225 under the first metal layer 227.

Further referring to FIG. 2O, a third metal layer 305,211 made of copper is formed by electroplating in the second openings 304a in the first solder mask 304 and in the third openings 210a in the second solder mask 210 and the fourth openings 202a in the first dielectric layer 202. In the example, solder bumps 306 and solder layers 212 are formed on the surface of the third metal layer 305,211 after formation of the third metal layer 305,211 in the second openings 304a, the third openings 210a, and the fourth openings 202a, wherein the third metal layer 305,211 serves as a post to thereby reduce the quantity of solder material needed for the solder bumps 306 as well as the solder layers 212. Finally, as shown in FIG. 2P, a metal supporting frame 307 is attached on the surface of the first solder mask 304 to thereby increase overall rigidity of the coreless packaging substrate.

In the embodiment above, the method to form the first metal layer 227 in FIG. 2D as well as the second metal layer 301 in FIG. 2I, and the third metal layer 305,211 in FIG. 2O is one of electroplating and electroless plating, while the method of forming the solder bump 306 along with the solder layer 212 in FIG. 2O is one of electroplating and printing.

In the embodiment above, the first metal layer 227 in FIG. 2D as well as the second metal layer 301 in FIG. 2I, and the third metal layer 305,211 in FIG. 2O is selected from one of copper, aluminum, tin, nickel, chromium, and an alloy of a combination of the above metals, while the solder bump 306 along with the solder layer 212 in FIG. 2O is selected from one of tin, gold, nickel, chromium, titanium, silver, copper, aluminum, lead, and an alloy of a combination of the above metals.

Thus, the coreless packaging substrate fabricated in this example has higher density of circuit layout, simplified process, reduced overall product thickness, and achieves the goal of miniaturization.

Although the present invention has been explained in relation to its preferred embodiment, it is to be understood that many other possible modifications and variations can be made without departing from the scope of the invention as hereinafter claimed.

What is claimed is:

1. A method to manufacture a coreless packaging substrate, the steps comprising:
   (A) providing a carrier board and forming a first dielectric layer on one surface of the carrier board, and forming a first resistive layer on a surface of the first dielectric layer, wherein a plurality of first openings are formed in the first resistive layer to expose parts of the carrier board;
   (B) forming a first metal layer in each of the first openings, and removing the first resistive layer;
   (C) forming a built-up structure on the surfaces of the first dielectric layer and the first metal layers, wherein the built-up structure includes at least a dielectric layer, at least a second metal layer of patterned circuit, a plurality of conductive vias, as well as a plurality of conductive pads;
   (D) removing the carrier board;
   (E) forming a first solder mask on a surface of the built-up structure and forming a second solder mask on the surface of the first dielectric layer, wherein a plurality of second openings are formed in the first solder mask to expose the conductive pads of the built-up structure, and a plurality of third openings are formed in the second solder mask to expose parts of the first dielectric layer, and the third openings correspond to the first metal layers;
   (F) forming a plurality of fourth openings in the exposed first dielectric layer to expose parts of the first metal layers; and
   (G) forming a plurality of solder bumps in the second openings in the first solder mask, and forming a plurality of solder layers in the third openings in the second solder mask.

2. The method of claim 1, further comprises a step (F1) before forming the solder bumps in the second openings and forming the solder layers in the third openings: forming a third metal layer as a post in at least one of the second openings in the first solder mask and the third openings in the second solder mask along with the fourth openings in the first dielectric layer, to thereby reduce the quantity of solder material needed for the solder bumps as well as the solder layers.

3. The method of claim 1, further comprises a step (H) after forming the solder bumps and the solder layers in step (G): attaching at least a metal supporting frame on the surface of the first solder mask, so as to increase overall rigidity of the substrate.

4. The method of claim 1, wherein the method to form the first openings in the first resistive layer in step (A) as well as that to form the second openings in the first solder mask in step (E) and the third openings in the second solder mask in step (E) is photolithography, while the method to form the fourth openings in the first dielectric layer in step (F) is laser ablation.

5. The method of claim 1, wherein the method to form the first metal layer in step (B) as well as that to form the second metal layer in step (C) is one of electroplating and electroless plating.

6. The method of claim 1, wherein the first metal layer in step (B) as well as the second metal layer in step (C) is selected from one of copper, aluminum, tin, nickel, chromium, and an alloy of a combination of the above metals.

7. The method of claim 1, wherein the method to remove the carrier board in step (D) is etching.

8. The method of claim 1, wherein the method to form the solder bump as well as the solder layer in step (G) is one of electroplating and printing.

9. The method of claim 1, wherein the solder bump as well as the solder layer in step (G) is selected from one of tin, gold, nickel, chromium, titanium, silver, copper, aluminum, lead, and an alloy of a combination of the above metals.

10. The method of claim 2, wherein the method to form the third metal layer in step (F1) is one of electroplating and electroless plating.

11. The method of claim 2, wherein the third metal layer in step (F1) is selected from one of copper, aluminum, tin, nickel, chromium, and an alloy of a combination of the above metals.

* * * * *